US008497697B2

(12) United States Patent
Blaney (10) Patent No.: US 8,497,697 B2
(45) Date of Patent: Jul. 30, 2013

(54) APPARATUS AND METHOD FOR TESTING MULTIPLE INTEGRATED CIRCUIT DEVICES ON A FILM FRAME HANDLER

(75) Inventor: Gerard Blaney, Limerick (IE)

(73) Assignee: Analog Devices, Inc., Norwood, MA (US)

( * ) Notice: Subject to any disclaimer, the term of this patent is extended or adjusted under 35 U.S.C. 154(b) by 456 days.

(21) Appl. No.: 12/815,174

(22) Filed: Jun. 14, 2010

(65) Prior Publication Data

US 2011/0306166 A1 Dec. 15, 2011

(51) Int. Cl.
*G01R 31/26* (2006.01)
(52) U.S. Cl.
USPC .................................................. 324/762.01
(58) Field of Classification Search
USPC ............... 324/754.01–754.3, 755.01–755.11, 324/762.01–762.1; 257/48; 438/14–18
See application file for complete search history.

(56) References Cited

U.S. PATENT DOCUMENTS

| 4,480,150 | A | 10/1984 | Jones et al. | |
| 6,573,739 | B1 * | 6/2003 | Saito | 324/750.25 |
| 6,690,185 | B1 * | 2/2004 | Khandros et al. | 324/756.03 |
| 2005/0176171 | A1 | 8/2005 | Miyaki et al. | |
| 2009/0091013 | A1 | 4/2009 | Fukuda et al. | |

OTHER PUBLICATIONS

International Search Report dated Oct. 4, 2011 in PCT Application No. PCTUS2011039500.

* cited by examiner

*Primary Examiner* — Tung X Nguyen
(74) *Attorney, Agent, or Firm* — Knobbe Martens Olson & Bear LLP (57) ABSTRACT

Film frame assemblies and apparatus for testing and singulating integrated circuit packages, as well as associated methods for forming a film frame assembly, and testing and singulating integrated circuit packages are disclosed. A plurality of leads on a lead frame are cut to form singulated integrated circuit packages. Apparatus and methods are disclosed for mechanically aligning a set of electrical contacts attached to a contactor body with a plurality of leads on a singulated integrated circuit package.

25 Claims, 10 Drawing Sheets

FIG. 10

APPARATUS AND METHOD FOR TESTING MULTIPLE INTEGRATED CIRCUIT DEVICES ON A FILM FRAME HANDLER

FIELD OF THE INVENTION

The present disclosure relates generally to methods and apparatus for singulating and testing integrated circuit packages.

DESCRIPTION OF THE RELATED ART

Film frame assemblies are used to carry integrated circuits, dies or chips during the semiconductor packaging and testing process. The integrated circuits are mounted onto a lead frame. Electrical interconnections are formed between the leads and the integrated circuits, using known packaging techniques such as wirebonding (e.g. thermosonic bonding) and flip chip techniques (e.g., controlled collapse chip connection, or C4). The lead frame and mounted chips are then covered with a thin encapsulant, such as epoxy to encapsulate the chips, preventing physical damage or corrosion thereto. A film frame assembly is formed by mounting one or more lead frames on a film or membrane extending across an opening in a film frame or other generally rigid structure. The leads extending between the chips and the lead frame are cut in a saw-singulation process, separating the singulated integrated circuit packages from each other and from the remainder of the lead frame. The film frame assembly can then be used within a semiconductor test device to test the singulated integrated circuit packages. However, movement of the integrated circuit packages on the film frame can interfere with accurate testing.

SUMMARY

One embodiment provides a method for forming a film frame assembly, comprising providing a film frame including a plastic film for supporting lead frames during singulation and testing. The method further comprises mounting a lead frame on the film, the lead frame comprising an array of integrated circuit packages and a frame portion surrounding the array, wherein a plurality of leads connect the adjacent integrated circuit packages in the array to each other. The method further comprises cutting through the leads to form a singulated integrated circuit package, wherein cutting comprises leaving at least three sides of the frame portion intact such that the at least three sides of the frame portion extend along at least three sides of the array in an unbroken manner.

Another embodiment provides a film frame assembly for testing and singulating integrated circuit packages. The film frame assembly comprises a film frame including a plastic film for supporting lead frames and a lead frame mounted on the film. The lead frame comprises an array of integrated circuit packages, wherein a plurality of the integrated circuit packages are singulated. The lead frame further comprises a frame portion surrounding the array, at least three sides of the frame portion extending unbroken to limit relative movement among the singulated packages.

Another embodiment provides an apparatus for testing a plurality of singulated integrated circuit packages. The apparatus comprises a contactor body configured to be positioned proximate to an array of singulated integrated circuit packages within a lead frame mounted on a film frame assembly. The apparatus further comprises a first set of electrical contacts attached to the contactor body. The first set comprises a first plurality of electrical contacts configured to be able to contact and test a first plurality of leads on a first integrated circuit package. The apparatus further comprises a first guide member positioned on the contactor body, wherein the first guide member is configured to substantially mechanically align the first set of electrical contacts with the first plurality of leads when the contactor body is positioned proximate to the array of integrated circuit packages.

Another embodiment provides a method for testing an array of singulated integrated circuit packages within a lead frame mounted on a film frame assembly. The method comprises providing a contactor body. The method further comprises providing a plurality of sets of electrical contacts attached to the contactor body, each set comprising a plurality of electrical contacts configured to be able to contact and test a plurality of leads on a singulated integrated circuit package within the array. The method further comprises providing a first guide member on the contactor body. The method further comprises moving the contactor body and the array proximate to each other such that the first guide member is positioned between a first singulated integrated circuit package within the array and a second singulated integrated circuit package adjacent to the first singulated integrated circuit package within the array, causing the first guide member to substantially mechanically align a first set of electrical contacts within the plurality of sets of electrical contacts with a first plurality of leads on the first singulated integrated circuit package.

For purposes of summarizing the invention and the advantages achieved over the prior art, certain objects and advantages of the invention have been described above and as further described below. Of course, it is to be understood that not necessarily all such objects or advantages may be achieved in accordance with any particular embodiment of the invention. Thus, for example, those skilled in the art will recognize that the invention may be embodied or carried out in a manner that achieves or optimizes one advantage or group of advantages as taught herein without necessarily achieving other objects or advantages as may be taught or suggested herein.

All of these embodiments are intended to be within the scope of the invention herein disclosed. These and other embodiments of the present invention will become readily apparent to those skilled in the art from the following detailed description of the preferred embodiments having reference to the attached figures, the invention not being limited to any particular preferred embodiment(s) disclosed.

BRIEF DESCRIPTION OF THE DRAWINGS

The appended drawings are schematic, not necessarily drawn to scale, and are meant to illustrate and not to limit embodiments of the invention.

DETAILED DESCRIPTION OF THE DRAWINGS

The present disclosure relates generally to packaging equipment for integrated circuit packages, including film frame assemblies and contact bodies for singulating and testing integrated circuit packages, as well as associated methods for forming a film frame assembly, forming contact bodies, and testing and singulating integrated circuit packages. Certain embodiments relate to methods for cutting through a plurality of leads on a lead frame to form a singulated integrated circuit package. Certain embodiments relate to apparatus and methods for mechanically aligning a set of electrical contacts attached to a contactor body with a plurality of leads on a singulated integrated circuit package.

Singulation processes can cut through the entire width, length and thickness of the lead frame to completely sever each chip package from other chip packages and the frame. Because of the elasticity of the plastic membrane of the film frame assembly, the integrated circuit packages can move relative to each other and/or relative to the remainder of the lead frame assembly during the singulation and testing process, causing misalignment between the integrated circuit packages and the test equipment. Such movement and misalignment can be expensive, due to reduced yield, testing accuracy, throughput, etc.

The disclosed embodiments provide methods of forming a film frame assembly, and the resulting structure, without cutting through the entire length and/or width of the lead frame during the singulation process. This reduces the possible range of relative movement among the integrated circuit packages on the film frame during the singulation process and/or during the testing of the singulated integrated circuit packages. The disclosed embodiments also provide apparatus and methods for testing a plurality of integrated circuit packages. A contact body of the testing equipment is provided with at least one guide member configured to substantially mechanically align the contacts on the contact body with leads on an integrated circuit package. These embodiments can be used separately or in combination to increase yield, testing accuracy, throughput, and the like, during the singulation and testing of the integrated circuit packages. It should be understood that the disclosed embodiments present examples for illustrative purposes, and that the scope of the concepts and advantages described herein is not limited to those examples.

Figure 1:
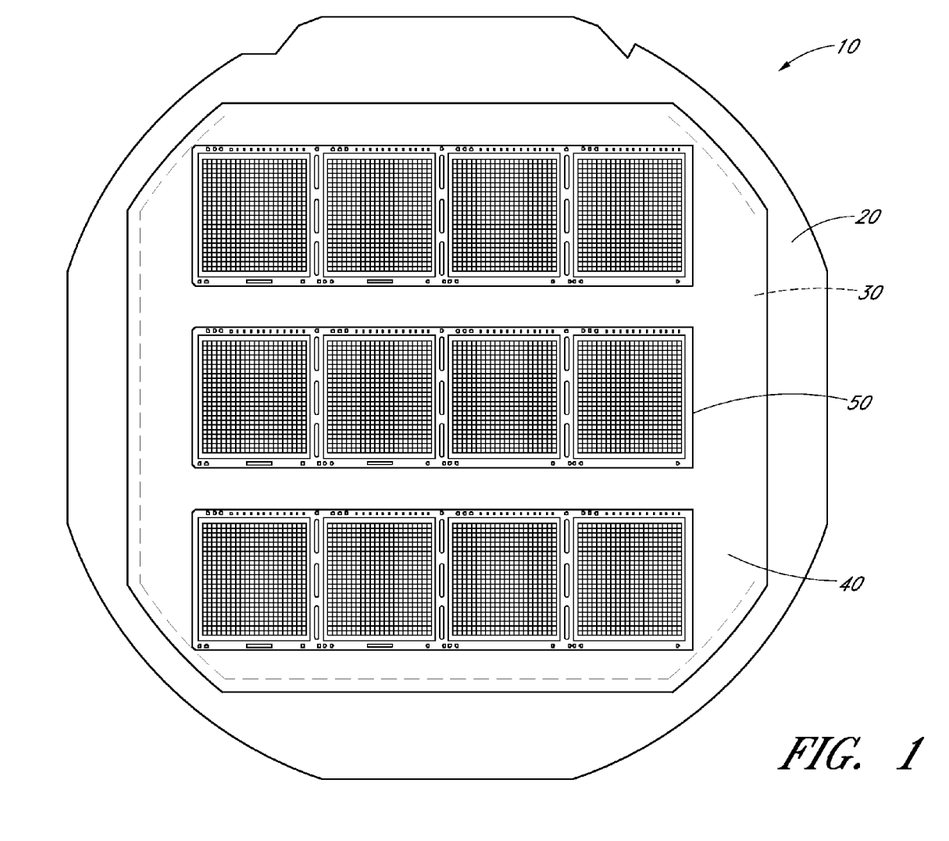
FIG. 1 is a top plan view of a film frame assembly.

FIG. 1 schematically illustrates a a film frame assembly 10 that can be used to carry a plurality of integrated circuit packages during the singulation and testing processes. The film frame assembly 10 can comprise a supporting structure, illustrated as a film frame 20, to carry one or more lead frame(s) 50. In some embodiments, an opening 30 can extend through the film frame 20, with a film 40 extending across the opening 30. The lead frames 50 can be mounted on the film 40 using any suitable technique, such as adhesive (e.g., pressure-sensitive adhesive). It will be understood that various numbers of lead frames 50 can be mounted on film 40, although three lead frames 50 are shown in the illustrated embodiment for exemplary purposes.

The film frame 20 can comprise any suitable shapes, sizes, materials and configurations. The film frame 20 can comprise an approximately rectangular, square, ovular, oblong, or other regular or irregular shape, and is illustrated for exemplary purposes as an approximately circular shape. The film frame 20 can comprise any of many different materials with sufficient rigidity to support the film 40 with the lead frame 50 mounted thereon, such as plastic or metal. The opening 30 can be approximately the same or different shape as the film frame 20, and can extend partially or completely therethrough. In the illustrated embodiment, the opening 30 extends through and is approximately the same shape as the film frame 20.

The film 40 can be configured to span some, most, or preferably all of the film frame 20 (e.g., to cover the opening 30). In some embodiments, the film 40 can be stretched under tension across some, most or all of the surface of film frame 20. The film 40 can be attached to the film frame 20 (or to an intermediate structure) in any suitable fashion, such as with adhesive (e.g., pressure sensitive adhesive) or other bonding techniques. In some embodiments, the film frame 20 can comprise two or more pieces configured to clamp the film 40 therebetween. The film 40 is typically plastic and can comprise, e.g., a thermoplastic polymer. The film 40 can comprise any suitable thickness sufficient to support the lead frames 50 and the individual packages during the singulation and testing of the integrated circuit packages, as described further herein. In a preferred embodiment, the film 40 comprises UV adhesive PVC film and is approximately 0.1 mm to 0.2 mm thick.

Figures 2, 4:
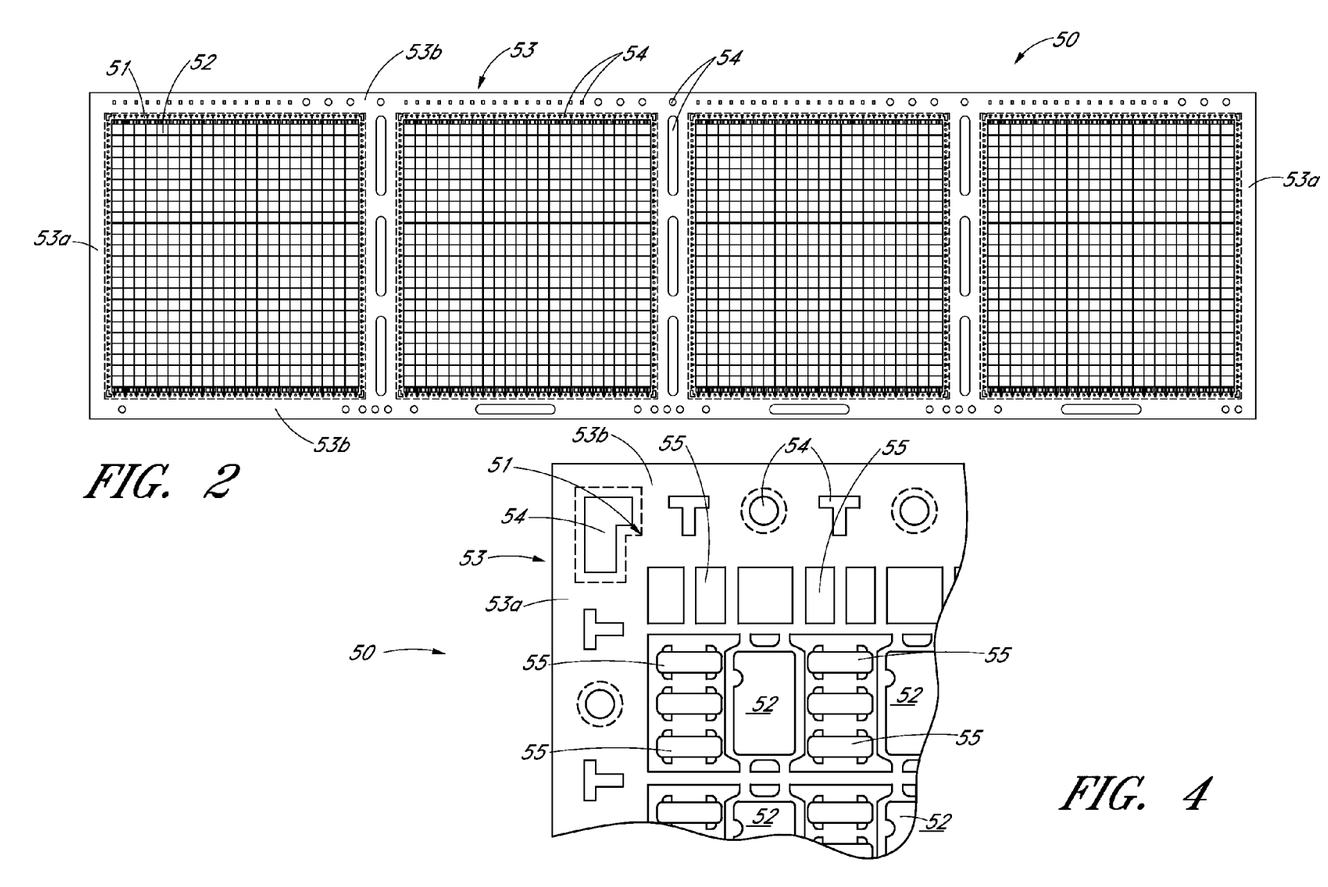
FIG. 2 is a top plan view of one of the lead frames shown in FIG. 1.
FIG. 4 is an enlarged view of a section 4-4 of the lead frame of FIG. 3.
Figure 3:
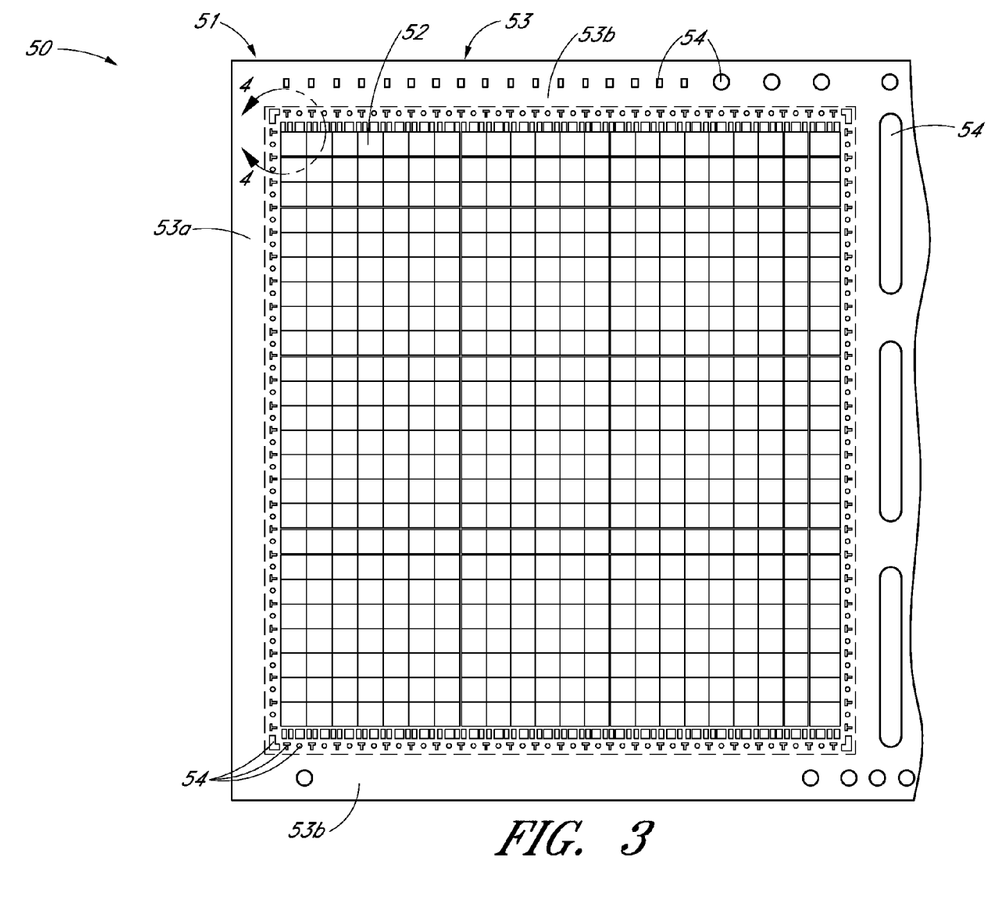
FIG. 3 is a top plan view of one block of integrated circuits in the lead frame of FIG. 2.

FIG. 2 schematically illustrates an embodiment of the lead frame 50. FIG. 3 is an enlarged view of one block of packages of the lead frame 50 of FIG. 2. FIG. 4 is an enlarged view of a section of the lead frame 50 of FIG. 3. Referring to FIGS. 2-4, the lead frame 50 can comprise one or more blocks or arrays 51 of integrated circuit or chip packages 52 carried by a supporting structure, such as a plastic or resin film. It will be understood that the lead frame 50 can comprise different numbers of arrays 51 aligned on the lead frame 50 in various configurations, and that the four arrays shown extending linearly along lead frame 50 are for illustrative purposes only. Thus, the lead frame 50 can comprise shapes other than the approximately rectangular shape shown, such as approximately square, oblong, or circular shapes.

Figure 9:
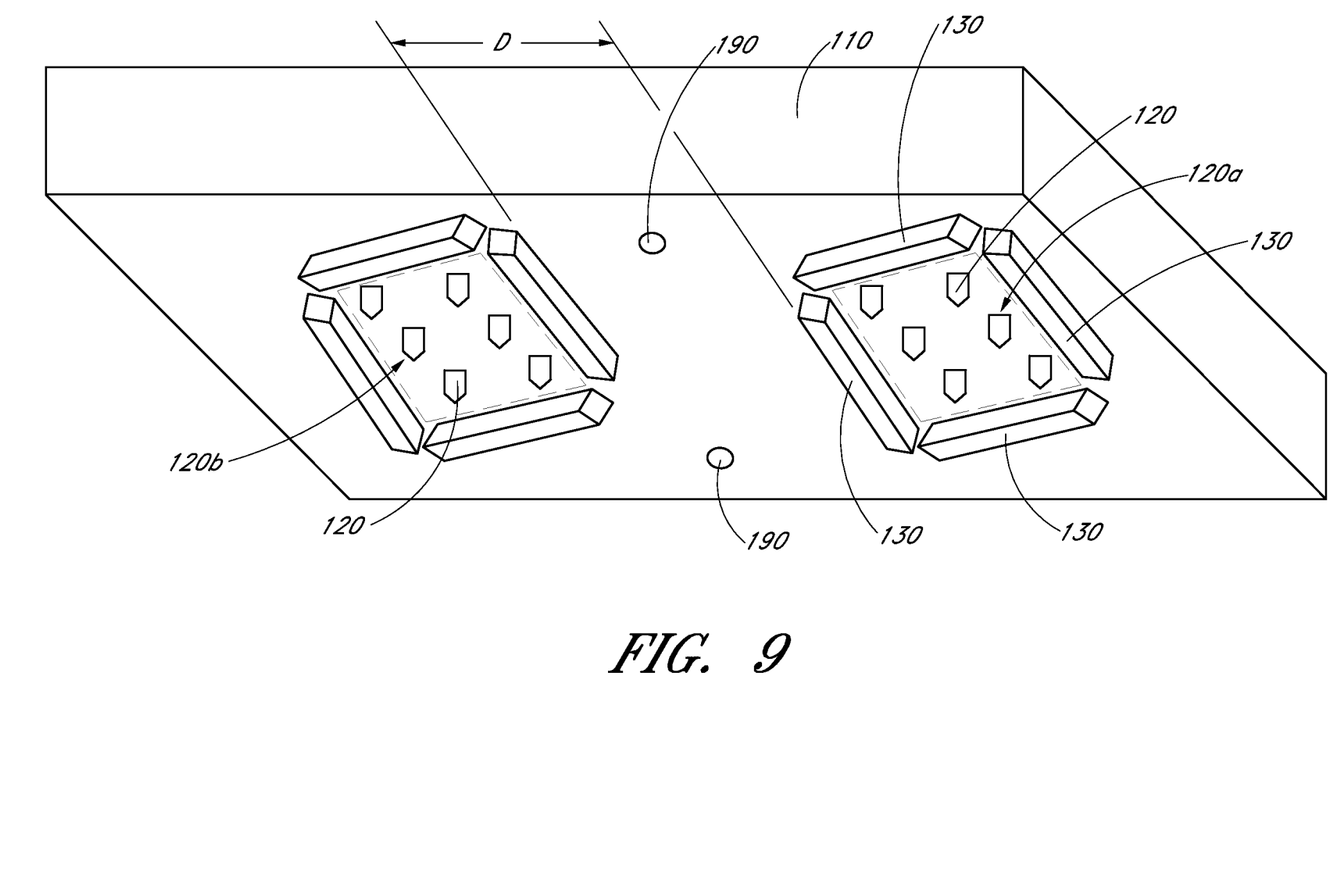
FIG. 9 is a schematic bottom, front, isometric view of an embodiment of the contactor body of FIGS. 7-8.

The lead frame 50 comprises a frame portion 53 surrounding the arrays 51. The frame portion 53 can be any of a variety of shapes, such as a curved, e.g. approximately circular shape, and can be the same or a different shape relative to the array 51. In the illustrated embodiment, the frame portion 53 comprises two pairs of opposed sides 53a and 53b that form an approximately rectangular frame around arrays 51. A plurality of handling elements 54 can be configured on the frame portion 53 proximate and spaced around the perimeter of the arrays 51. Handling elements 54 can facilitate the guiding, indexing, movement, and/or otherwise robotically controlling lead frame 50 and/or film frame assembly 10 (FIG. 1) during the processing of film frame assembly 10. Handling elements 41 can be controlled, e.g., with a control system 200 (FIG. 7) and/or one or more sensors 190 (FIG. 9). Handling elements 54 can extend partially or completely through frame portion 53, and/or can be marked on or visible through a surface of frame portion 53 using conventional methods.

Each block or array 51 comprises a plurality of integrated circuit packages 52. The array 51 is shown in FIG. 3 with twenty two integrated circuit packages 52 extending along the length of lead frame 50, and twenty four integrated circuit packages 52 extending along the width of lead frame 50 for a total of 528 packages 52 per array 51, but these numbers are for illustrative purposes only. A network of external leads 55 (FIG. 4) extends between chips of adjacent integrated circuit packages 52, and between the frame portion 53 and the chips of integrated circuit packages 52 adjacent to the frame portion 53, prior to singulation.

Figure 5:
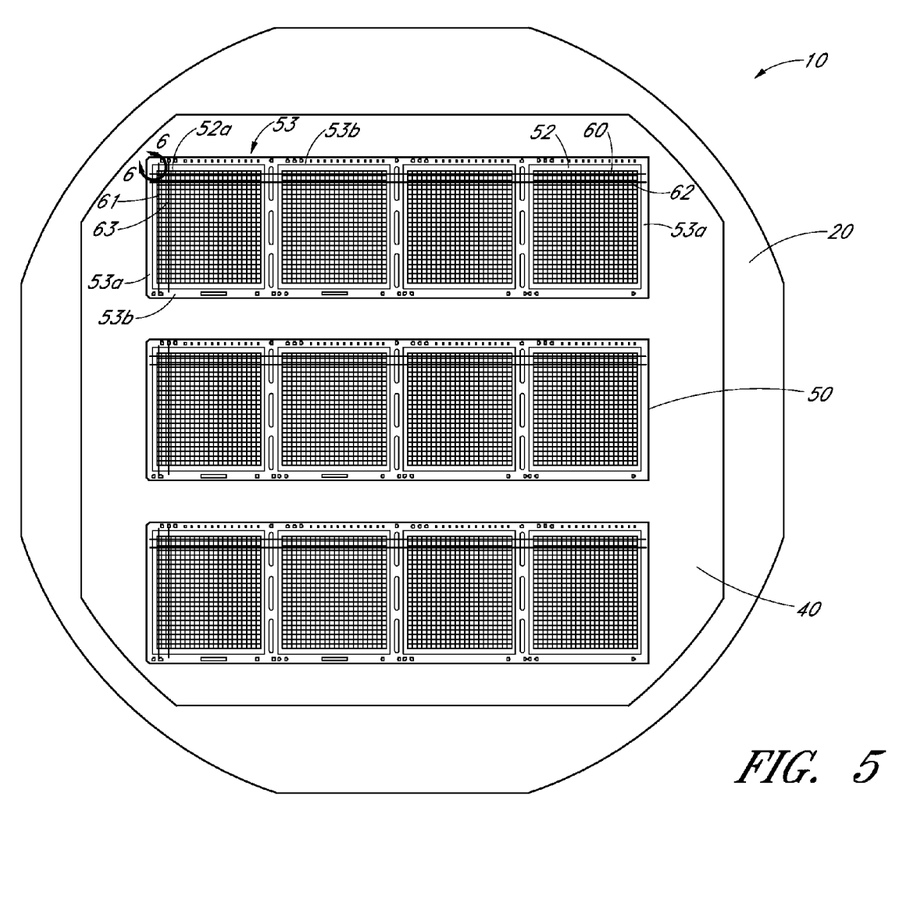
FIG. 5 is a top plan view of partially singulated integrated circuit packages in a film frame assembly, in accordance with one embodiment.
Figure 6A:
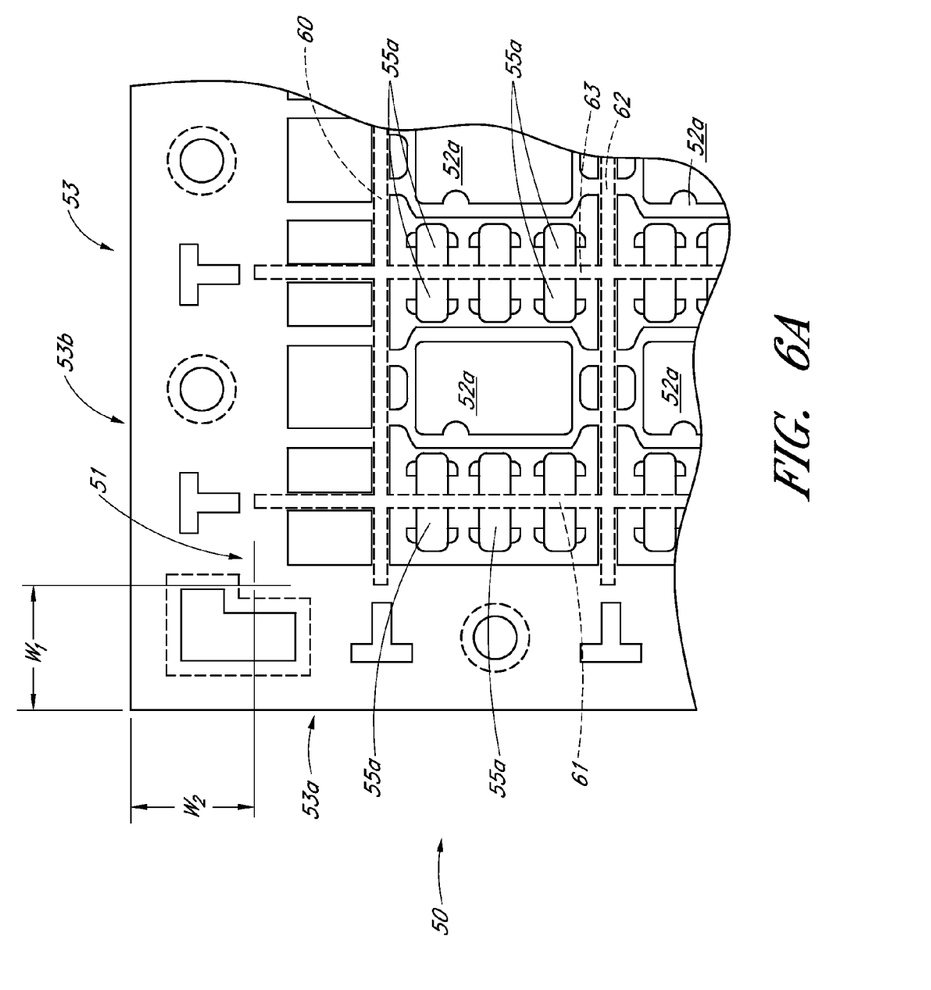
FIG. 6A is a schematic, enlarged view of a section 6-6 of the lead frame of FIG. 5.
Figure 6B:
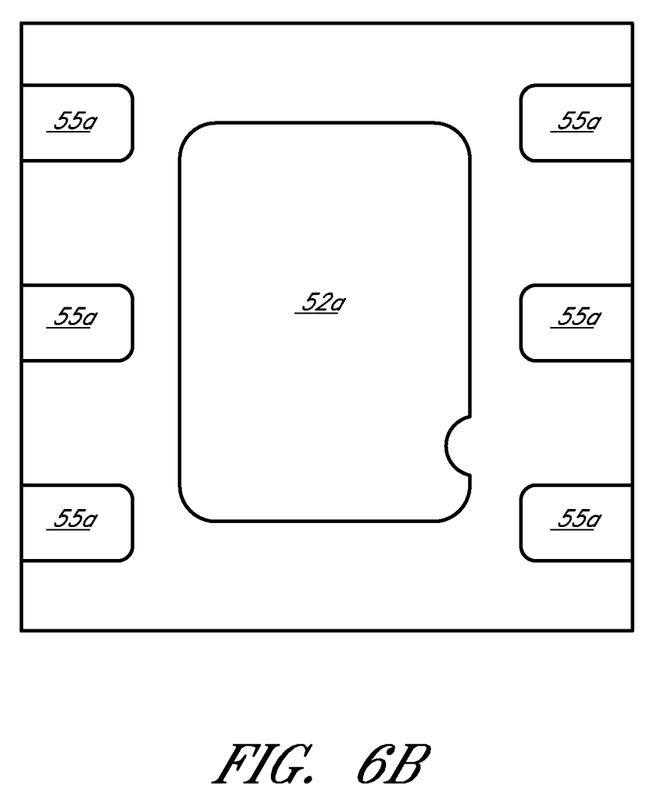
FIG. 6B is a top plan view of a singulated integrated circuit package.

FIG. 5 is a top plan view of an embodiment of a partial singulation process for the integrated circuit packages 52 mounted on the film frame assembly 10. FIG. 6A is an enlarged view of the lead frame 50 of the encircled region 6-6 of FIG. 5. FIG. 6B is a top plan view of a singulated integrated circuit package. Referring to FIGS. 5-6B, the integrated circuit packages 52 can be singulated (e.g., separated from each other) to form singulated integrated circuit packages 52a by sawing or otherwise cutting through the lead frame 50, and in some embodiments, partially into the film 40, illustrated as cuts 60-63. The cuts 60-63 are shown in hidden lines for clarity. The cuts 60-63 extend between the integrated circuit packages 52 (e.g., cuts 62-63), or between the integrated circuit packages 52 and the sides of frame portion 53 (e.g., cuts 60 and 61). The cuts 60-63 extend through the external leads 55, to form a plurality of leads 55a corresponding to each integrated circuit package 52. It will be understood that although only cuts 60-63 are shown, additional cuts substantially similar to 60-63 will be used to cut through the remainder of the leads 55a in the arrays 51.

More extensive cuts extending through the width, length, and thickness of the lead frame would separate the frame portion into a plurality of pieces. In the illustrative embodiment, the cuts 60-63 can extend partially across the width (e.g., cuts 61 and 63) and/or partially across the length (e.g., cuts 60 and 62) of the lead frame 50, without cutting through the entire length and/or width of the lead frame 50. As such, frame portion 53 can be left intact, to form an unbroken perimeter individually or collectively surrounding arrays 51. By leaving frame portion 53 intact, the movement of the integrated circuit packages 52 relative to each other and relative to frame portion 53 can be reduced, improving the yield, accuracy, alignment, etc., during the singulation and testing processes. Cutting through the frame portion 53 would allow stretching or sagging of the film 40 across the entire film frame assembly 10 (e.g., 300 mm×300 mm) to affect the position of any singulated package 52a. In contrast, the illustrated process confines stretching that could affect relative positions of singulated packages to the area within each lead frame 50 (e.g., 246 mm×66 mm).

As shown in FIG. 6A, the cuts 60 and 62 can stop short of cutting through the entire length of lead frame 50 by a distance W1 from the end of the side 53a of the lead frame 50. The length of distance W1 can be selected depending on the amount of rigidity and support desired within frame portion 53, and the type of materials used within lead frame 50. In some embodiments, W1 can range from approximately 0.5 mm to 20 mm, preferably approximately 1 mm to 10 mm, and in the illustrated embodiment is approximately 1 mm to 3 mm.

The cuts 61 and 63 can stop short of cutting through the entire width of lead frame 50 by a distance W2 from the end of the side 53b of lead frame 50. Distances W1 and W2 can be the same or different lengths relative to each other. Distance W2 can comprise a similar range of distances and can allow frame portion 53 to function substantially similarly to that provided by distance W1.

Preferably, at least two opposite sides of the frame portion 53 and one segment connecting the two opposites remain intact. It will by understood that the cuts 60 and 62 can stop short of cutting through the entire length of lead frame 50 from either or both ends of sides 53a of the lead frame 50. Similarly, the cuts 61 and 63 can stop short of cutting through the entire width of lead frame 50 from either or both ends of sides 53b of the lead frame 50 (FIG. 5). In some embodiments, cuts 60 and 62 can stop short of cutting through one side 53a, while cutting through the opposite side 53a of frame portion 53. In some embodiments, cuts 61 and 63 can stop short of cutting through one side 53b, while cutting through the opposite side 53b of frame portion 53. In a preferred embodiment, cuts 60-63 cut through lead frame 50 to leave at least three sides of frame portion 53 are connected and intact, such that the at least three sides of frame portion 53 extend along at least three sides of arrays 51 in an unbroken manner. Allowing the cuts to extend through one frame portion side 53a and 53b would expose the packages 53a to movement from stretching of the film outside the frame in that direction, but would nevertheless limit movement from the other sides. Relative movement from film stretching is most curtailed by leaving the frame portion 53 uncut on all sides after singulation, such that the unsevered frame portion surrounds the singulated packages 52a, as shown in FIG. 5. The skilled artisan can readily extend the teachings herein to non-rectangular lead frame shapes.

In an exemplary method for forming the film frame assembly 10, the film frame 20 is provided, and can include a film 40 (e.g., a plastic film) for supporting one or more lead frames 50 during singulation and testing of the integrated circuit packages 52. The lead frame 50 is mounted on the film 40. The lead frame 50 comprises one or more array(s) 51 of integrated circuit packages 52 and the frame portion 53 surrounding the array(s) 51. The plurality of leads 55 can connect the adjacent integrated circuit packages 52 in the array 51 to each other. The leads 55 can be cut through, forming a singulated integrated circuit package 52a. In some embodiments, cutting comprises leaving at least three sides (e.g., three of opposed pairs 53a, 53b) of the frame portion 53 intact such that the at least three sides of the frame portion 53 extend along at least three sides of the array 51 in an unbroken manner. In some embodiments, the cutting step comprises leaving the frame portion 53 intact such that the frame portion 53 forms an unbroken perimeter surrounding the array 51. In some embodiments, the cutting step comprises leaving the film 40 intact.

Figure 7:
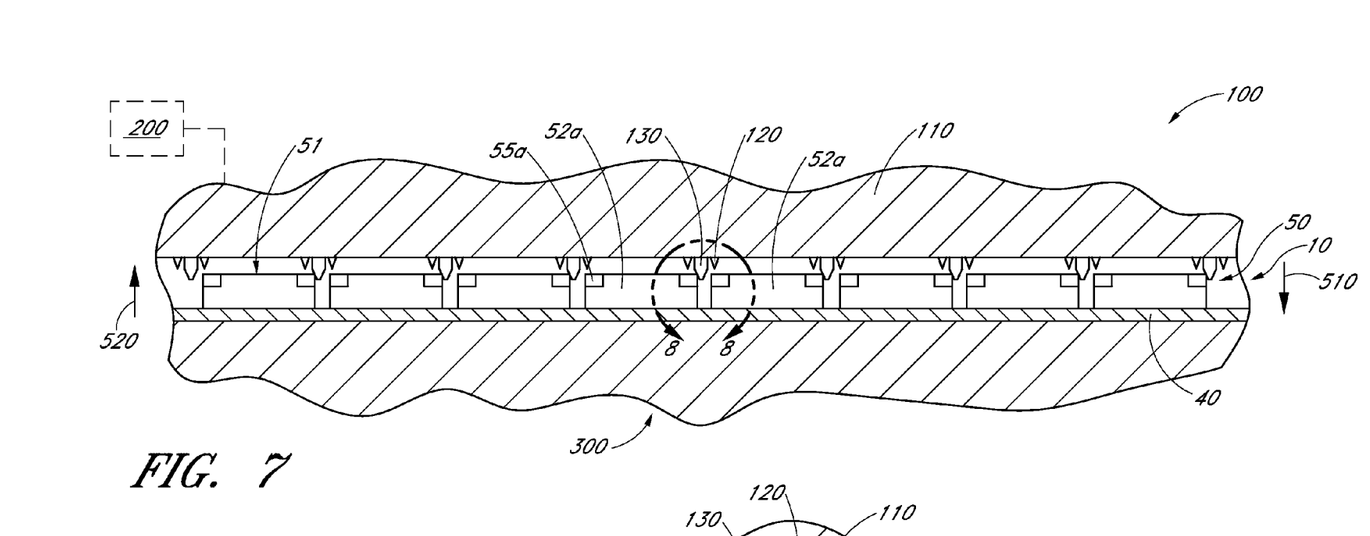
FIG. 7 is a schematic, partial side cross-sectional view of an apparatus for testing a plurality of singulated integrated circuit packages in a film frame assembly, in accordance with one embodiment.
Figure 8:
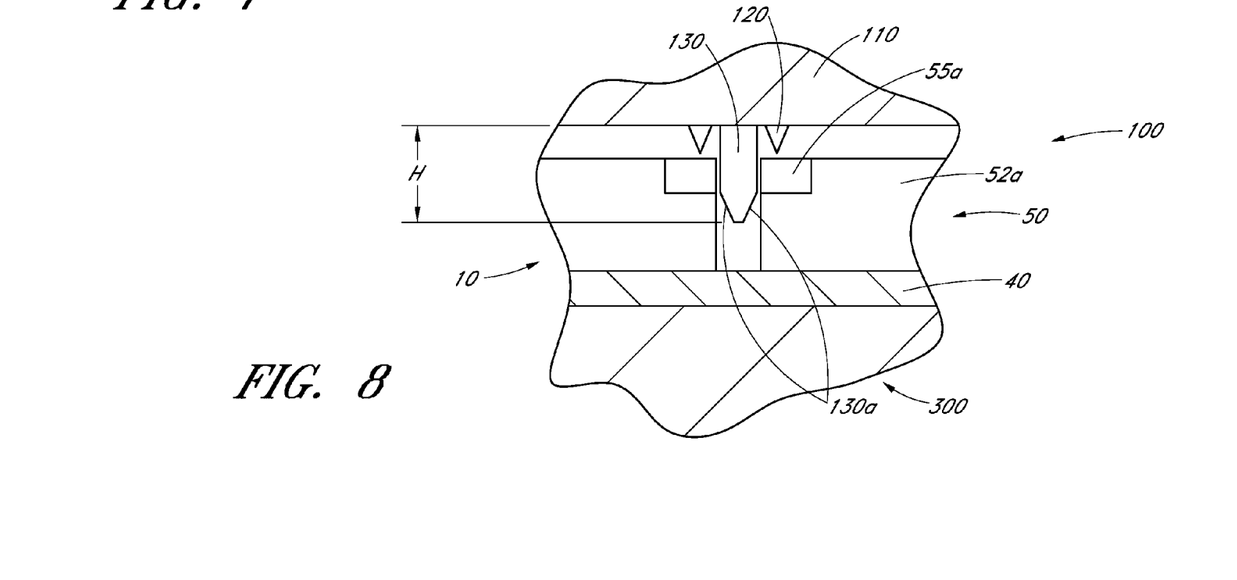
FIG. 8 is a close-up view of a section 8-8 of the testing apparatus of FIG. 7.

FIG. 7 schematically illustrates a partial side cross-sectional view of an embodiment of an apparatus 100 for testing a plurality of singulated integrated circuit packages 52a. The testing apparatus 100 can be controlled by a control system 200, which can include software that controls the apparatus and methods described further herein. FIG. 8 schematically illustrates an enlarged view of the apparatus 100 of encircled section 8-8 of FIG. 7. Referring to FIGS. 7-8, the testing apparatus 100 comprises a contactor body 110 configured to be positioned proximate to the array 51 during the testing of the singulated integrated circuit packages 52a. The packages 52a can be conventionally singulated or singulated by the process of FIGS. 5-6. A plurality of electrical contacts 120 extend from a surface of the contactor body 110. The electrical contacts 120 are arranged in sets, sized and spaced to be able to contact and test a plurality of leads 55a on the singulated integrated circuit packages 52a when the contactor body 110 is positioned proximate to the array 51 of singulated integrated circuit packages 52a.

The testing apparatus 100 can comprise a handler plate 300 configured to support and hold film frame assembly 10 and lead frame 50 during the testing of the array 51 of singulated integrated circuit packages 52a. The handler plate 300 can comprise any suitable configuration for handlers used in the field of integrated circuit testing equipment. In the illustrated embodiment, handler plate 300 is configured to receive film frames 20, and supports their films 40 during testing. The handler plate 300 and/or contactor body 110 can move horizontally and/or vertically relative to each other to align and contact the contacts 120 with corresponding leads 55a during a testing process.

FIG. 9 is a schematic, bottom front isometric view of an embodiment of the contactor body 110 of FIGS. 7-8. The electrical contacts 120 can be grouped into one or more sets (e.g., sets 120a, 120b), wherein each set is configured to contact a set of leads 55a on a corresponding integrated circuit package 52a. Typically, the contact body includes multiple sets (two shown) in order to simultaneously test multiple singulated integrated circuit packages 52a for high throughput.

In some embodiments, the sets 120a and 120b can be spaced from each other by a distance D. Such spacing can allow additional electronic components or circuitry to be incorporated in the contactor body 110 between sets 120a and 120b. Such circuitry can provide additional features beneficial to the testing of the integrated circuit packages 52a within the array 51, and/or the control of film frame assembly 10 (e.g., the handling, movement, alignment, etc. of film frame assembly 10; FIGS. 7-8). In some embodiments, electrical decoupling circuitry, which often employs large capacitors, is positioned between sets 120a and 120b to electrically isolate the sets 120a and 120b from each other, reducing cross-talk or electronic interference between adjacent testing circuitry for packages 52a under test during the testing process. Spacing the sets 120a and 120b from each other can allow the sets 120a and 120b to simultaneously test, two corresponding singulated integrated circuit packages 52a spaced from each other. "Simultaneously test" as used herein refers to the testing while simultaneous contact is made between two sets of contacts and corresponding leads, including a first test on a first integrated circuit package, followed by a second test on a second integrated circuit package, without breaking contact between the first and second test. As described further herein (FIGS. 10 and 11), the distance D can be selected such that one or more integrated circuits 52a can be positioned in the film frame assembly 10 between those integrated circuits 52a being tested by the sets 120a and 120b.

The contactor body 110 can also comprise one or more optical alignment features 190 (e.g., a vision system) to aid the control system 200, and facilitate the alignment and movement of the contactor body 110 and the handler plate 300 (FIGS. 7-8) relative to each other. It will be understood that the optical alignment features 190 can be positioned on the contactor body 110 between sets 120a and 120b, as shown in FIG. 9, or in other positions on the contactor body 110. Typically, such optical alignment features 190 work in conjunction with sensors on the handler plate 300 side of the equipment, or vice versa. However, such optical alignment does not obviate misalignment problems that can result from stretching of the film 40.

Referring to FIGS. 7-9, the contactor body 110 comprises a guide member 130 positioned on the contactor body 110. The guide member 130 can be configured to substantially mechanically align the first set of electrical contacts with the first plurality of leads when the contactor body is positioned proximate to the array 51 of singulated integrated circuit packages 52a. In some embodiments, the guide member 130 can be sized and shaped to fit between adjacent singulated packages 52a of the film frame assembly. In one embodiment, the guide member 130 can fit between adjacent packages separated by a distance between about 0.5 and 5 mm, more particularly, between about 1 mm and 3 mm. In use, as the contactor body 110 is moved towards the handler plate 300, as shown by arrow 510 (FIG. 7) and/or as the handler plate 300 is moved towards the contactor body 110, as shown by arrow 520 (FIG. 7), if there is slight misalignment, the guide member 130 contacts a portion (e.g., a top edge) of the singulated integrated circuit package 52a, guiding the package 52a (e.g., horizontally or laterally) into alignment with the set of contacts 120 and allowing the guide member 130 to extend between the singulated integrated circuit package 52a and an adjacent integrated circuit package 52a. Thus, guide member 130 can align contacts 120 with leads 55a on the integrated circuit packages 52a, increasing the testing accuracy and increasing yield for the testing process.

The guide member 130 can comprise any of a variety of shapes. Guide member 130 can comprise a pin, rod or sidewall with various cross-sectional shapes (e.g., circular, rectangular, and the like), extending transversely along and/or longitudinally from contactor body 110. Regardless of shape, the guide member 130 comprises a protrusion extending a height H from a surface of the contactor body 110 (FIG. 8). The height H is selected to be less than the thickness of singulated integrated circuit package 52a to be tested, to prevent guide member 130 from extending beyond the bottom edge of integrated circuit package 52a (e.g., and contacting or piercing the film 40). In some embodiments, the height H is less than 1 mm, and in some embodiments, less than 0.5 mm. In the illustrated embodiment, the guide member 130 includes a chamfered, sloped, curved, or radiused edge 130a (FIG. 8) at its distal end, such that relative vertical movement between the contactor body 110 and the array of singulated packages can be translated into relative horizontal movement upon contact between the chamfered edge 130a and the corner of a package 52a, allowing the guide member 130 to be inserted between two adjacent integrated circuit packages 52a.

The guide members 130 can comprise any suitable material but are preferably electrically insulating. Even conductive materials can be used, although the guide members 130 do not electrically communicate with any circuitry. Elastomeric materials (e.g., rubber) can advantageously minimize risk of damage to packages 52a during operation.

Figure 10:
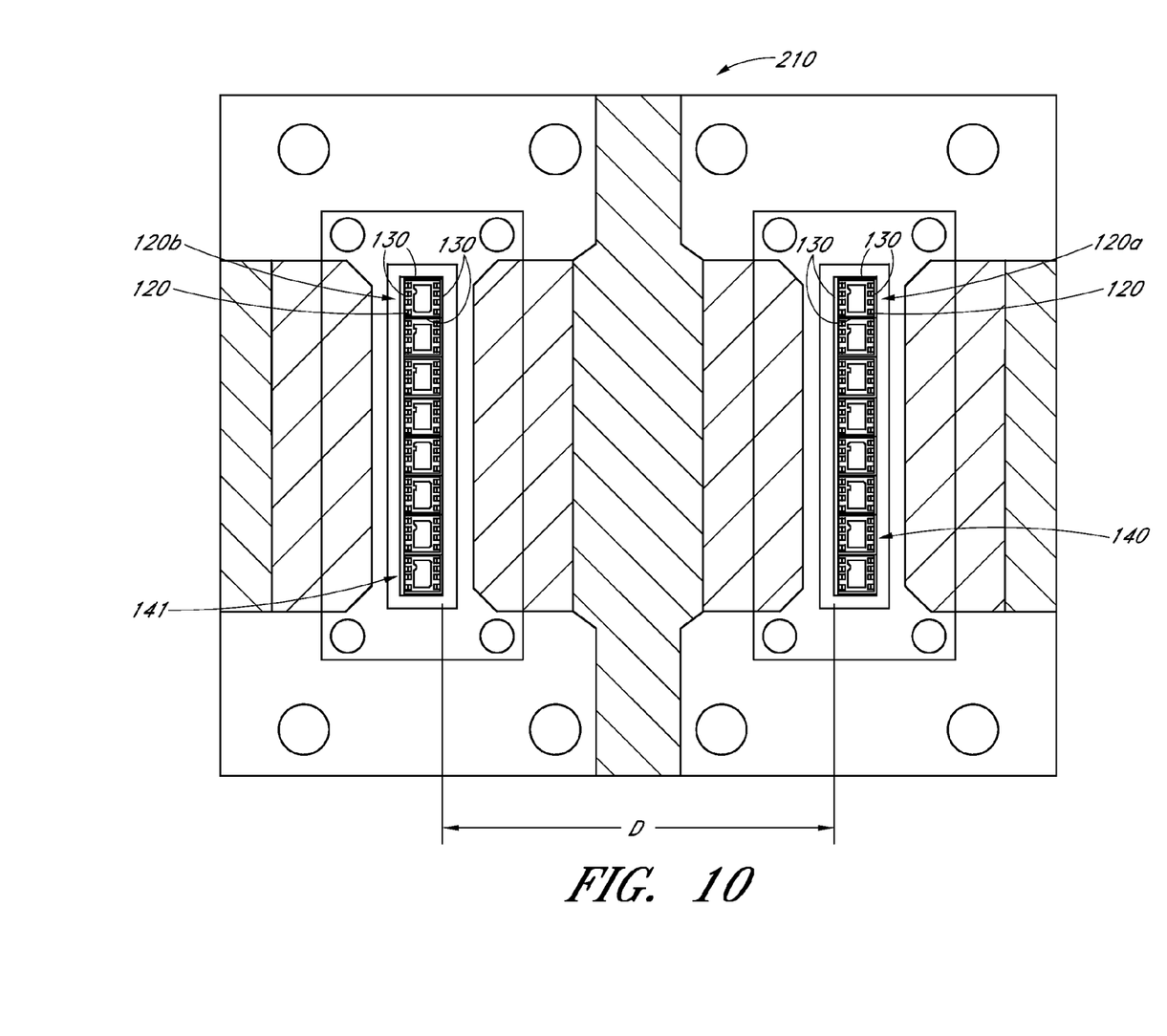
FIG. 10 is a bottom plan view of an embodiment of a contactor body.
Figure 11:
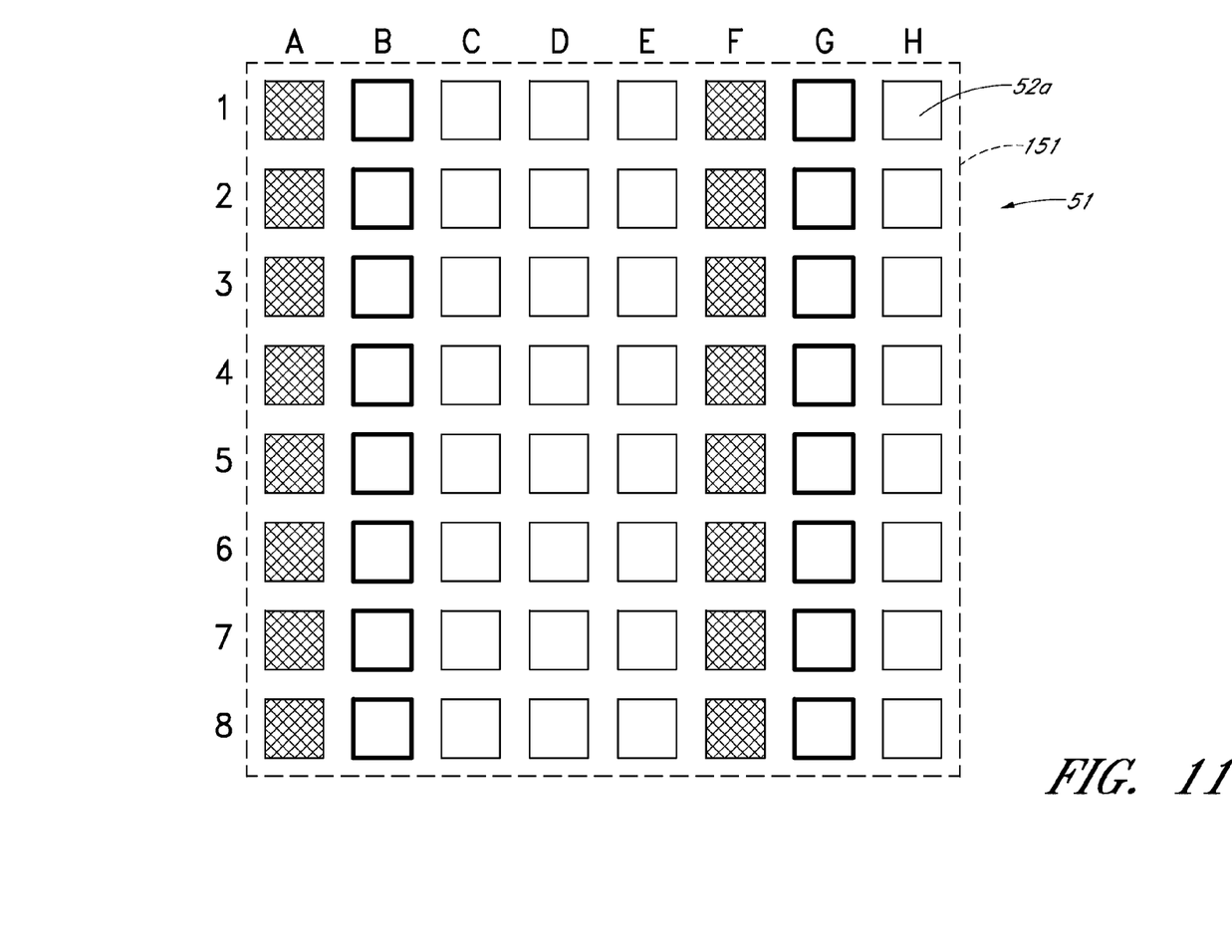
FIG. 11 schematically illustrates a stepping pattern for testing an array of integrated circuit packages.

The contactor body 110 can be configured with a plurality of guide members 130 positioned to surround each integrated circuit package 52a to facilitate the alignment of the contacts 120 with the leads 55a. In some embodiments, contactor body 110 can be configured with a plurality of guide members 130 configured to be positioned between (and thus align) a plurality of adjacent singulated integrated circuit packages 52a (e.g., a row or a column of singulated integrated circuit packages; FIGS. 7, 10-11). While FIG. 9 shows guide members 130 surrounding each contactor set 120a, 120b, it will be understood that the guide members 130 can be arranged in a grid to surround even packages 52a not tested in a particular step, such that a set of guide members 130 may surround a package 52a in use but be empty of contacts.

FIG. 10 is a bottom plan view of an embodiment of a contactor body 210 configured with a plurality of sets 120a and 120b of contacts 120. The contactor body 210 can be similar to and function substantially similarly to contactor body 110 shown in FIGS. 7-9. The plurality of sets 120a and 120b of contacts 120 can be grouped into a first group 140 and a second group 141, respectively. The first group 140 can be positioned adjacent to the second group 141, or, as shown in the illustrated embodiment, the first group 140 can be spaced apart from the second group 141 by the distance D.

The groups 140 and 141 can comprise different numbers of sets 120*a*, 120*b* of contacts 120, respectively, and the groups 140 and 141 can comprise the same or different numbers of sets 120*a*, 120*b* relative to each other. The groups 140 and 141 are each shown with eight sets 120*a*, 120*b* of contacts 120, for illustrative purposes only. It will also be understood that the plurality of sets 120*a* and 120*b* can be positioned in various manners relative to one another within groups 140 and 141, respectively, to form various testing patterns and to allow various testing sequences when testing the integrated circuits 52*a* within array 51. Thus, the groups 140 and 141 are not to be limited to a single row or column of a plurality of adjacent sets 120*a*, 120*b*, respectively of contacts 120, as shown in FIG. 10. The groups 140 and 141 can comprise a plurality of sets 120*a*, 120*b* spaced adjacent or apart from each other in a row, column, checkerboard, L-shaped, T-shaped, or other pattern.

FIG. 11 is a top plan view of a portion 151 of the array 51. The portion 151 of array 51 is shown as a series of squares labeled by row and column to schematically illustrate the positioning of the singulated integrated circuit packages 52*a* on a film frame that can be simultaneously tested using various configurations of groups 140 and 141 (FIG. 10). For ease of illustration, reference numerals are provided for rows 1-8, and reference letters for columns A-H. The use of "rows" and "columns" herein does not imply a particular orientation of the portion 151 of the array 51 relative to its positioning on lead frame 50 (FIG. 1).

Referring to FIGS. 10 and 11, the portion 151 of the array 51 of singulated integrated circuit packages 52*a* can be tested by moving contactor body 210 and the portion 151 of array 51 mounted on the film frame proximate to each other. One or more guide members 130 can mechanically align the contacts 120 within groups 140 and 141 with the leads 55*a* (FIGS. 6A-6B) corresponding to the singulated integrated circuit packages A1-A8 and F1-F8. The contactor body 210 and array 51 can be vertically (assuming the orientation of FIGS. 7-8) relative to each other such that the contacts 120 within groups 140, 141 are in electrical communication with the integrated circuit packages A1-A8 and F1-F8, allowing packages A1-A8 and F1-F8 to be simultaneously tested (Test Position 1). The integrated circuit packages A1-A8 and F1-F8 are shown cross-hatched in FIG. 11 for illustration of the groupings. Next, the contactor body 210 and array 51 can be moved sufficiently away from each other to sever the electrical communication between the packages A1-A8, F1-F8 and the corresponding contacts 120 within groups 140, 141 on body 210, and to withdraw the guide members 130 from between adjacent packages 52*a*. Subsequently, the contactor body 210 and array 51 can be moved (e.g., horizontally stepped or indexed) relative to each other to mechanically align the contacts 120 within groups 140, 141 with the leads 55*a* (FIGS. 6A-6B) corresponding to the singulated integrated circuit packages B1-B8 and G1-G8. The contactor body 210 and array 51 can be further moved vertically relative to each other such that the contacts 120 within groups 140, 141 are in electrical communication with the integrated circuit packages B1-B8 and G1-G8, allowing packages B1-B8 and G1-G8 to be simultaneously tested (Test Position 2). The integrated circuit packages B1-B8 and G1-G8 are shown bolded in FIG. 11 for illustration of the groupings. The above steps can be repeated, thus stepping or indexing through the remainder of portion 151 and, in some embodiments, through the remainder of array 51 until the entirety of array 51 is tested. In some embodiments, an optical alignment step can be performed prior to and/or subsequent to the step of moving contactor body 210 and the array 51 relative to each other.

It will be understood that the configurations of group 140 and/or 141 can be selected to correspond to various testing patterns within the portion 151 of array 51. For example, the distance D between groups 140 and 141 can be selected using the contactor body 210 (FIG. 10) to simultaneously test other columns with packages A1-A8, such as columns B1-B8, C1-C8, D1-D8, etc. In some embodiments, groups 140 and 141 can be configured to simultaneously test smaller groups of integrated circuit packages, such as A1-A4 with H1-H4. In other embodiments, the indexing of contactor body 210 and array 51 relative to each other can be performed in different directions; for example, A1-A4 can be simultaneously tested with C1-C4, and after indexing, B2-B5 can be simultaneously tested with D2-D5. In some embodiments, groups 140 and 141 can be spaced apart from each other, and the sets of contacts within groups 140 and 141 can be spaced apart from each other. In such an embodiment, A3 and A6 can be simultaneously tested with E3 and E6 (Position 1), and after indexing, A4 and A7 can be simultaneously tested with E4 and E7 (Position 2). In some embodiments, groups 140 and/or 141 can comprise a checkerboard pattern, allowing, for example, simultaneous testing of C2, C4, and C6, with D3 and D5 (Position 1), and after indexing, D2, D4 and D6 with E3 and E5.

Advantageously, both the maintenance of the frame portion 53 during and after saw singulation (FIG. 5) and the use of guide members 130 between singulated packages 52*a* (FIGS. 7-8) independently aid alignment of contacts 120 with leads on the packages 52*a*. Thus, either or both features enable good alignment with packages of a film frame assembly 10, despite the tendency of the film 40 to stretch. Better alignment allows the design choice of more widely separating adjacent contact sets, at least in one dimension, which in turn accommodates decoupling circuitry. In one embodiment, the distance between adjacent contact sets in at least one dimension is chosen to be between about 10 mm and 100 mm. In another embodiment, the distance between adjacent contact sets is chosen to be between about 40 mm and 50 mm. In view of the embodiment shown in FIG. 10, it will be understood that such separation can be provided in one dimension (e.g., distance D in FIG. 10), while contactor sets 120*b* of one group 141 can be more closely spaced (e.g., 1-3 mm).

Although certain preferred embodiments and examples have been discussed herein, it will be understood by those skilled in the art that the present invention extends beyond the specifically disclosed embodiments to other alternative embodiments and/or uses of the invention and obvious modifications and equivalents thereof. In addition, while a number of variations of the invention have been shown and described in detail, other modifications, which are within the scope of this invention, will be readily apparent to those of skill in the art based upon this disclosure. It is also contemplated that various combinations or sub-combinations of the specific features and aspects of the embodiments may be made and still fall within the scope of the invention. Accordingly, it should be understood that various features and aspects of the disclosed embodiments can be combined with or substituted for one another in order to form varying modes of the disclosed invention. Thus, it is intended that the scope of the present invention herein disclosed should not be limited by the particular disclosed embodiments described above, but should be determined only by a fair reading of the present disclosure, including the appended claims.

What is claimed is:

1. An apparatus for testing a plurality of singulated integrated circuit packages, comprising:
a contactor body configured to be positioned proximate to an array of singulated integrated circuit packages within a lead frame mounted on a film frame assembly;
a first set of electrical contacts attached to the contactor body, the first set comprising a first plurality of electrical contacts configured to be able to contact and test a first plurality of leads on a first integrated circuit package;
a first guide member positioned on the contactor body, wherein the first guide member is configured to substantially mechanically align the first set of electrical contacts with the first plurality of leads when the contactor body is positioned proximate to the array of integrated circuit packages;
a second set of electrical contacts attached to the contactor body, the second set comprising a second plurality of electrical contacts configured to be able to contact and test a second plurality of leads on a second integrated circuit package; and
a second guide member positioned on the contactor body, wherein the second guide member is configured to substantially mechanically align the second set of electrical contacts with the second plurality of leads when the first set of electrical contacts is aligned with the first plurality of leads.

2. The apparatus of claim 1, wherein the film frame assembly is configured to support at least one lead frame comprising an array of singulated integrated circuit packages surrounded by a frame member, wherein the singulated integrated circuit packages within the array are separated from each other or are separated from the frame member by a gap.

3. The apparatus of claim 2, further comprising a handler, the handler configured to move the first electrical contact relative to the first lead.

4. The apparatus of claim 1, wherein the first guide member comprises a protrusion extending from a surface of the contactor body, the protrusion comprising a free distal end.

5. The apparatus of claim 4, wherein the first guide member extends less than 1 mm from the surface of the contactor body.

6. The apparatus of claim 4, wherein the first guide member extends less than 0.5 mm from the surface of the contactor body.

7. The apparatus of claim 1, wherein the first guide member comprises a chamfered tip to facilitate the substantial mechanical alignment of the first electrical contact with the first lead.

8. The apparatus of claim 1, wherein the first guide member comprises a plurality of protrusions extending from a surface of the contactor body, the plurality of protrusions comprising a plurality of free distal ends configured to substantially surround a singulated integrated circuit package within the array.

9. The apparatus of claim 1, wherein the first guide member and the second guide member are spaced apart from each other sufficiently to allow a third integrated circuit package to be positioned between the first and the second integrated circuit packages.

10. The apparatus of claim 9 such that a third plurality of leads on a third integrated circuit package can be positioned between the first and second plurality of leads.

11. The apparatus of claim 9, wherein the contactor body comprises one or more electronic components positioned between the first guide member and the second guide member that electrically isolate the first set of electrical contacts from the second set of electrical contacts.

12. The apparatus of claim 1, further comprising an optical alignment system configured to substantially align the first set of electrical contacts with the first plurality of leads when the contactor body is positioned proximate to the array of integrated circuit packages.

13. The apparatus of claim 1, further comprising a control system with software configured to substantially align the first and second sets of electrical contacts with the first and second pluralities of leads, respectively, and substantially align the first and second sets of electrical contacts with a third plurality of leads on a third integrated circuit package and a fourth plurality of leads on a fourth integrated circuit package, respectively, the third and the fourth plurality of leads spaced apart from the first and the second plurality of leads.

14. An apparatus for testing a plurality of singulated integrated circuit packages, comprising:
a contactor body configured to be positioned proximate to an array of singulated integrated circuit packages within a lead frame mounted on a film frame assembly;
a first set of electrical contacts attached to the contactor body, the first set comprising a first plurality of electrical contacts configured to be able to contact and test a first plurality of leads on a first integrated circuit package; and
a first guide member positioned on the contactor body, wherein the first guide member is configured to substantially mechanically align the first set of electrical contacts with the first plurality of leads when the contactor body is positioned proximate to the array of integrated circuit packages; and
an optical alignment system configured to substantially align the first set of electrical contacts with the first plurality of leads when the contactor body is positioned proximate to the array of integrated circuit packages.

15. The apparatus of claim 14, wherein the film frame assembly is configured to support at least one lead frame comprising an array of singulated integrated circuit packages surrounded by a frame member, wherein the singulated integrated circuit packages within the array are separated from each other or are separated from the frame member by a gap.

16. The apparatus of claim 14, wherein the first guide member comprises a chamfered tip to facilitate the substantial mechanical alignment of the first electrical contact with the first lead.

17. The apparatus of claim 14, wherein the first guide member comprises a plurality of protrusions extending from a surface of the contactor body, the plurality of protrusions comprising a plurality of free distal ends configured to substantially surround a singulated integrated circuit package within the array.

18. The apparatus of claim 14, wherein the first guide member extends less than 1 mm from the surface of the contactor body.

19. An apparatus for testing a plurality of singulated integrated circuit packages, comprising:
a contactor body configured to be positioned proximate to an array of singulated integrated circuit packages within a lead frame mounted on a film frame assembly;
a first set of electrical contacts attached to the contactor body, the first set comprising a first plurality of electrical contacts configured to be able to contact and test a first plurality of leads on a first integrated circuit package; and
a first guide member positioned on the contactor body, wherein the first guide member is configured to substantially mechanically align the first set of electrical contacts with the first plurality of leads when the contactor body is positioned proximate to the array of integrated circuit packages;

wherein the film frame assembly is configured to support at least one lead frame comprising an array of singulated integrated circuit packages surrounded by a frame member, wherein the singulated integrated circuit packages within the array are separated from each other or are separated from the frame member by a gap.

20. The apparatus of claim 19, wherein the first guide member comprises a plurality of protrusions extending from a surface of the contactor body, the plurality of protrusions comprising a plurality of free distal ends configured to substantially surround a singulated integrated circuit package within the array.

21. The apparatus of claim 19, wherein the first guide member comprises a chamfered tip to facilitate the substantial mechanical alignment of the first electrical contact with the first lead.

22. The apparatus of claim 19, wherein the first guide member extends less than 1 mm from the surface of the contactor body.

23. An apparatus for testing a plurality of singulated integrated circuit packages, comprising:

a contactor body configured to be positioned proximate to an array of singulated integrated circuit packages within a lead frame mounted on a film frame assembly;

a first set of electrical contacts attached to the contactor body, the first set comprising a first plurality of electrical contacts configured to be able to contact and test a first plurality of leads on a first integrated circuit package; and a first guide member positioned on the contactor body, wherein the first guide member is configured to substantially mechanically align the first set of electrical contacts with the first plurality of leads when the contactor body is positioned proximate to the array of integrated circuit packages;

wherein the first guide member comprises a protrusion extending from a surface of the contactor body, the protrusion comprising a free distal end.

24. The apparatus of claim 23, wherein the first guide member comprises a chamfered tip to facilitate the substantial mechanical alignment of the first electrical contact with the first lead.

25. The apparatus of claim 23, wherein the first guide member extends less than 1 mm from the surface of the contactor body.

* * * * *